United States Patent
Cooper et al.

(10) Patent No.: US 10,290,540 B2
(45) Date of Patent: May 14, 2019

(54) DISUBSTITUTED ALKYNE DICOBALT HEXACARBONYL COMPOUNDS, METHOD OF MAKING AND METHOD OF USE THEREOF

(71) Applicant: Versum Materials US, LLC, Tempe, AZ (US)

(72) Inventors: Alan Charles Cooper, Macungie, PA (US); Sergei Vladimirovich Ivanov, Schnecksville, PA (US); Moo-Sung Kim, Gyunggi-do (KR)

(73) Assignee: VERSUM MATERIALS US, LLC, Tempe, AZ (US)

(*) Notice: Subject to any disclaimer, the term of this patent is extended or adjusted under 35 U.S.C. 154(b) by 0 days.

(21) Appl. No.: 15/843,080

(22) Filed: Dec. 15, 2017

(65) Prior Publication Data

US 2018/0122687 A1    May 3, 2018

Related U.S. Application Data

(63) Continuation-in-part of application No. 15/790,931, filed on Oct. 23, 2017.

(60) Provisional application No. 62/415,822, filed on Nov. 1, 2016.

(51) Int. Cl.
| | |
|---|---|
| C23C 16/16 | (2006.01) |
| H01L 21/768 | (2006.01) |
| H01L 23/532 | (2006.01) |
| H01L 21/285 | (2006.01) |
| H01L 21/02 | (2006.01) |
| C23C 16/455 | (2006.01) |

(52) U.S. Cl.
CPC .......... *H01L 21/7685* (2013.01); *C23C 16/16* (2013.01); *C23C 16/45553* (2013.01); *H01L 21/02068* (2013.01); *H01L 21/28556* (2013.01); *H01L 21/28562* (2013.01); *H01L 21/28568* (2013.01); *H01L 21/76849* (2013.01); *H01L 23/53209* (2013.01); *H01L 23/53238* (2013.01); *H01L 21/76843* (2013.01)

(58) Field of Classification Search
None
See application file for complete search history.

(56) References Cited

U.S. PATENT DOCUMENTS

| | | |
|---|---|---|
| 9,385,033 B2 | 7/2016 | Blackwell et al. |
| 9,540,408 B2 | 1/2017 | Peters |
| 2015/0093890 A1 | 4/2015 | Blackwell et al. |
| 2016/0115588 A1 | 4/2016 | Gatineau et al. |
| 2017/0114452 A1 | 4/2017 | Peters |

FOREIGN PATENT DOCUMENTS

| | | | |
|---|---|---|---|
| JP | 2015224227 A2 | 12/2015 | |
| WO | 2014052316 A1 | 4/2014 | |
| WO | 2014118748 A1 | 8/2014 | |
| WO | 2015127092 A1 | 8/2015 | |
| WO | WO-2015127092 A1 * | 8/2015 | .............. C07F 15/06 |

OTHER PUBLICATIONS

Keunwoo, Lee, et al., "Characteristics of Cobalt Films Deposited by Metal Organic Chemical Vapor Deposition Method Using Dicobalt Hexacarbonyl tert-Butylacetylene," Japanese Journal of Applied Physics, vol. 47, No. 7, 2008, p. 5396-5399.

Georgi, C., et al., "A cobalt layer deposition study: Dicobaltatetrahedranes as convenient MOCVD precursor systems," J. Mater. Chem. C., 2014, 2, 4576-4582.

* cited by examiner

*Primary Examiner* — Clinton A Brooks
*Assistant Examiner* — Kofi Adzamli
(74) *Attorney, Agent, or Firm* — Lina Yang

(57) ABSTRACT

Described herein are cobalt compounds, processes for making cobalt compounds, cobalt compounds used as precursors for depositing cobalt-containing films (e.g., cobalt, cobalt oxide, cobalt nitride, cobalt silicide etc.); and cobalt films. Examples of cobalt precursor compounds are (disubstituted alkyne) dicobalt hexacarbonyl compounds. Examples of surfaces for deposition of metal-containing films include, but are not limited to, metals, metal oxides, metal nitrides, and metal silicides. Disubstituted alkyne ligands with alkyl groups such as linear alkyls and branched alkyls to form cobalt complexes which are used for selective deposition on certain surfaces and/or superior film properties such as uniformity, continuity, and low resistance.

4 Claims, 6 Drawing Sheets

On SiO$_2$, 175 °C, 20 sec.
Continuous, 2.7-2.9 nm

On SiO$_2$, 175 °C, 15 sec.
Continuous, 2.1-2.2 nm

DISUBSTITUTED ALKYNE DICOBALT HEXACARBONYL COMPOUNDS, METHOD OF MAKING AND METHOD OF USE THEREOF

CROSS-REFERENCE TO RELATED APPLICATIONS

The present patent application is a continuation in part of U.S. patent application Ser. No. 15/790,931 filed on Oct. 23, 2017 which claims the benefit of US Provisional Patent Application Ser. No. 62/415,822 filed Nov. 1, 2016. The disclosures are hereby incorporated by reference.

BACKGROUND OF THE INVENTION

Described herein are cobalt compounds, processes for making cobalt compounds, and compositions comprising cobalt compounds for use in deposition of cobalt-containing films.

Cobalt-containing films are widely used in semiconductor or electronics applications. Chemical Vapor Deposition (CVD) and Atomic Layer Deposition (ALD) have been applied as the main deposition techniques for producing thin films for semiconductor devices. These methods enable the achievement of conformal films (metal, metal oxide, metal nitride, metal silicide, etc.) through chemical reactions of metal-containing compounds (precursors). The chemical reactions occur on surfaces which may include metals, metal oxides, metal nitrides, metal silicides, and other surfaces.

Films of transition metals, particularly manganese, iron, cobalt, and ruthenium, are important for a variety of semiconductor or electronics applications. For example, cobalt thin films are of interest due to their high magnetic permittivity. Cobalt-containing thin films have been used as Cu/low-k barriers, passivation layers, and capping layers for ultra-large scale integrated devices. Cobalt is under consideration for replacement of copper in wiring and interconnects of integrated circuits.

Some Co film deposition precursors have been studied in the art.

US 2016/0115588 A1 discloses cobalt-containing film forming compositions and their use in film deposition.

WO 2015/127092 A1 describes precursors for vapor deposition of cobalt on substrates, such as in ALD and CVD processes for forming interconnects, capping structures, and bulk cobalt conductors, in the manufacture of integrated circuitry and thin film products.

US 2015/0093890 A1 discloses metal precursors and methods comprising decomposing a metal precursor on an integrated circuit device and forming a metal from the metal precursor. The metal precursors are selected from the group consisting of (alkyne) dicobalt hexacarbonyl compounds substituted with straight or branched monovalent hydrocarbon groups having one to six carbon atoms, mononuclear cobalt carbonyl nitrosyls, cobalt carbonyls bonded to one of a boron, indium, germanium and tin moiety, cobalt carbonyls bonded to a mononuclear or binuclear allyl, and cobalt compound comprising nitrogen-based supporting ligands.

WO 2014/118748 A1 describes cobalt compounds, the synthesis of said cobalt compounds, and the use of cobalt compounds in the deposition of cobalt-containing films.

Keunwoo Lee et al. (Japanese Journal of Applied Physics, 2008, Vol. 47, No. 7, 5396-5399) describes deposition of cobalt films by metal organic chemical vapor deposition (MOCVD) using tert-butylacetylene (dicobalt hexacarbonyl) (CCTBA) as cobalt precursor and $H_2$ reactant gas. The carbon and oxygen impurities in the film decrease with increased $H_2$ partial pressure but the lowest amount of amount of carbon in the film was 2.8 at. % at 150° C. Increasing deposition temperature resulted in high impurity contents and a high film resistivity attributed to excessive thermal decomposition of the CCTBA precursor.

C. Georgi et al. (J. Mater. Chem. C, 2014, 2, 4676-4682) teaches forming Co metal films from (alkyne) dicobalt hexacarbonyl precursors. However, those precursors are undesirable because the films still contain high levels of carbon and/or oxygen resulting in high resistivity. There is also no proof in the literature to support the ability to deposit continuous thin films of Co.

JP2015224227 describes a general synthetic process for producing (alkyne) dicobalt hexacarbonyl compounds. (Tert-butyl methyl acetylene) dicobalt hexacarbonyl (CCTMA) is used to generate cobalt films with low resistivity. However, no improvement in film properties relative to (tert-butylacetylene)dicobalt hexacarbonyl (CCTBA) was demonstrated. In addition, (tert-butyl methyl acetylene) dicobalt hexacarbonyl is a high melting (ca. 160° C.) solid. Precursors which are liquid at <=100° C., or, more preferably, <=30° C., are more desirable.

Generally, limited options exist for ALD and CVD precursors that deliver high purity cobalt films or exhibit high selectivity for deposition of cobalt films on one substrate vs. other substrates. To enhance film uniformity, film continuity, electrical properties of the deposited films, and film deposition selectivity, the development of novel precursors is necessary and is needed for thin, high-purity cobalt films and bulk cobalt conductors

SUMMARY

Described herein are cobalt compounds (or complexes, the terms compounds and complexes are exchangeable), processes for making cobalt compounds, compositions comprising cobalt metal-film precursors used for depositing cobalt-containing films; and cobalt containing films deposited using the cobalt compounds.

Examples of cobalt precursor compounds described herein, include, but are not limited to (alkyne) dicobalt hexacarbonyl compounds. Examples of cobalt-containing films include, but are not limited to cobalt films, cobalt oxide films, cobalt silicide and cobalt nitride films. Examples of surfaces for deposition of metal-containing films include, but are not limited to, metals, metal oxides, metal nitrides, silicon oxide and silicon nitride.

For certain applications, there is a need for better Co film nucleation and lower film resistivity for thin (1-2 nm) Co films deposited using known Co deposition precursors. As an example, there is a need for better Co film nucleation on TaN and lower film resistivity relative to thin Co films deposited using known Co deposition precursors.

For other applications, there is a need for selective deposition on certain surfaces. For example, selective deposition of cobalt films on copper metal surfaces vs. dielectric surfaces (e.g. $SiO_2$).

In one embodiment, the higher thermal stability of a cobalt-containing precursors with disubstitiuted alkyne ligands vs. cobalt-containing precursors with monosubstitiuted alkyne ligands are used to selectively deposit a cobalt-containing film on copper vs. dielectric surfaces.

Selective deposition is achieved by using cobalt compounds with ligands that can interact selectively with one surface vs. another surface. Alternatively, selective deposition is achieved by using cobalt compounds that react selectively with one surface vs. another surface.

In one embodiment, influence on metal deposition rate and/or metal film purity can be realized by altering the ligand dissociation energies by modification of the coordinated ligands of the Co film precursor. One method for altering the ligand dissociation energies is increasing or decreasing the size of the functional groups on a ligand. Furthermore, the number of functional groups on a ligand can alter the ligand dissociation energies. An example of influencing ligand dissociation energies is the observed variation of alkyne ligand dissociation energies from mono- and di-substituted (alkyne)dicobalt hexacarbonyl complexes.

In another embodiment, the melting point of the Co film precursor is lowered by changing the functional groups on the alkyne ligand.

In one aspect, the present invention discloses a disubstituted alkyne dicobalt carbonyl hexacarbonyl compound having the formula:

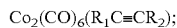

wherein $R_1$ is a tertiary alkyl group and $R_2$ is selected from the group consisting of a linear alkyl group having at least two carbon atoms, isopropyl and isobutyl.

In another aspect, the present invention discloses a method of synthesizing a disubstituted alkyne dicobalt carbonyl hexacarbonyl compound, comprising steps of:
adding disubstituted alkyne complex into dicobalt octacarbonyl in a solvent; wherein
the disubstituted alkyne complex has a structure of $R_1C\equiv CR_2$; wherein $R_1$ is a tertiary alkyl group and $R_2$ is selected from the group consisting of a linear alkyl group having at least two carbon atoms, isopropyl and isobutyl; and
the disubstituted alkyne reacts with dicobalt octacarbonyl in a solvent to form a disubstituted alkyne dicobalt carbonyl hexacarbonyl compound.

In yet another aspect, the present invention discloses a method of depositing a Co film on a substrate in a reactor, comprising:
providing the substrate to the reactor;
providing a Co precursor to the reactor;
contacting the substrate with the Co precursor; and
forming the Co film on the substrate;
wherein the Co precursor is a disubstituted alkyne dicobalt carbonyl hexacarbonyl compound having the formula $Co_2(CO)_6$ $(R_1C\equiv CR_2)$; wherein $R_1$ is a tertiary alkyl group and $R_2$ is a linear alkyl group; and
the substrate is selected from the group consisting of metal, metal oxide, metal nitride, silicon oxide, silicon nitride, and combinations thereof.

In yet another aspect, the present invention discloses a cobalt containing film deposited by using a disubstituted alkyne dicobalt carbonyl hexacarbonyl compound having the formula $Co_2(CO)_6$ $(R_1C\equiv CR_2)$; wherein $R_1$ is a tertiary alkyl group and $R_2$ is a linear alkyl group.

In yet another aspect, the present invention discloses a method of selectively depositing cobalt on a substrate in a reactor, comprising steps of:
providing the substrate to the reactor wherein the substrate comprises at least one patterned dielectric layer and at least one patterned conductive metal layer;
performing a pre-treatment to remove contaminates from surface of the substrate comprising at least surface of the at least one patterned conductive metal layer;
providing a Co precursor to the reactor;
contacting the substrate with the Co precursor; and
forming Co containing film on the substrate;
wherein
the Co precursor is a disubstituted alkyne dicobalt carbonyl hexacarbonyl compound having the formula $Co_2(CO)_6$ $(R_1C\equiv CR_2)$; wherein $R_1$ is a tertiary alkyl group and $R_2$ is a linear alkyl group, isopropyl and isobutyl; and
the Co containing film is selectively formed on the at least one patterned conductive metal layer with ratio of thickness of cobalt containing film formed on the at least one patterned conductive metal layer vs formed on the at least one patterned dielectric layer >1.

In yet another aspect, the present invention discloses a semiconductor device having a substrate having cobalt containing film deposited according to the method of selectively depositing cobalt on a substrate disclosed in the present invention.

The tertiary alkyl group includes, but is not limited to tert-butyl and tert-amyl; and the linear alkyl group includes, but is not limited to of n-ethyl, n-propyl, and n-butyl, n-pentyl, and n-hexyl.

The disubstituted alkyne dicobalt carbonyl hexacarbonyl compound includes, but is not limited to (2,2-Dimethyl-3-heptyne) dicobalt hexacarbonyl (CCTPA), (2,2,6-Trimethyl-3-heptyne) dicobalt hexacarbonyl (CCTIBA); (2,2-Dimethyl-3-octyne) dicobalt hexacarbonyl (CCTNBA); (2,2-Dimethyl-3-decyne) dicobalt hexacarbonyl (CCTHA), and (tert-butylmethylacetylene)dicobalt hexacarbonyl (CCTMA).

The cobalt containing film is preferably deposited by using a disubstituted alkyne dicobalt carbonyl hexacarbonyl compound in a liquid form at a temperature equal and less than 30° C.

The cobalt containing film includes, but is not limited to cobalt film, cobalt oxide film, cobalt silicide film, and cobalt nitride film. The cobalt containing film contains less than 2.5 at. %, preferably less than 1.5 at. %, and more preferably less than 0.5 at. % of carbon.

BRIEF DESCRIPTION OF THE DRAWINGS

The present invention will hereinafter be described in conjunction with the appended figures wherein like numerals denote like elements.

DETAILED DESCRIPTION

Figure 1:
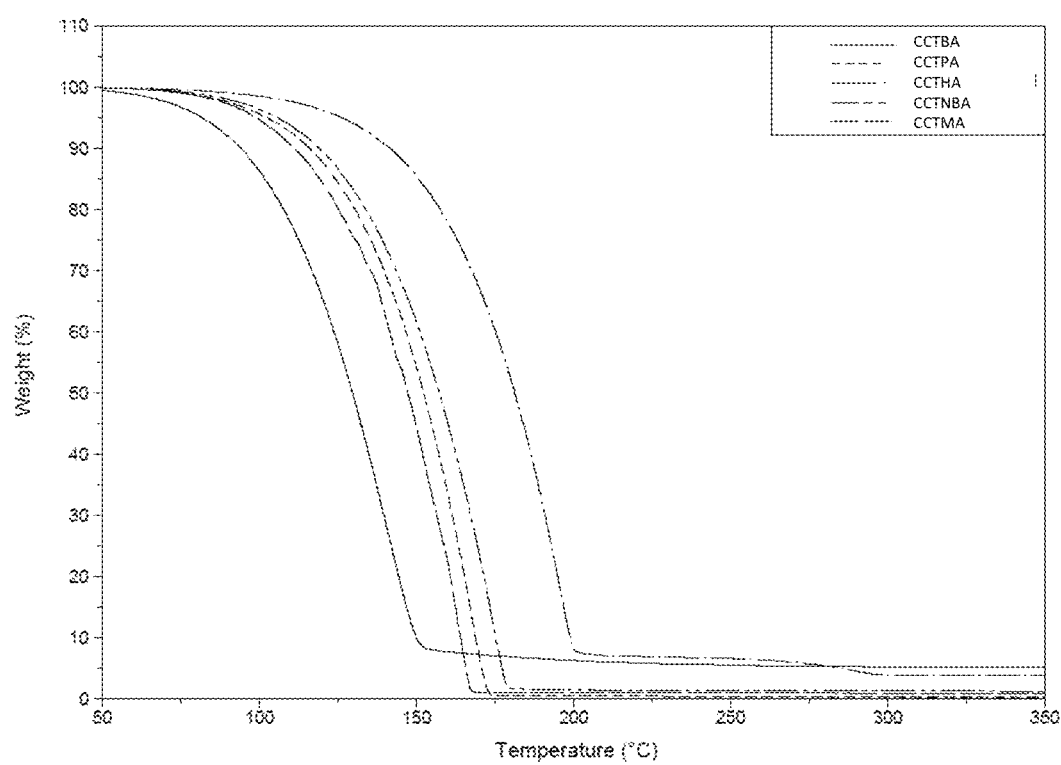
FIG. 1 displays an overlay of thermogravimetric analysis (TGA) data for a mono-substituted alkyne cobalt complex, (3,3-Dimethyl-1-butyne)dicobalt hexacarbonyl (CCTBA), and a series of di-substituted alkyne cobalt complexes, (tert-butyl R alkyne)dicobalt hexacarbonyl, where R=methyl (CCTMA), n-propyl (CCTPA), n-butyl (CCTNBA), and n-hexyl (CCTHA) measured under flowing nitrogen.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

Described herein are cobalt compounds, processes for making cobalt compounds, and compositions comprising cobalt metal-film precursors used for depositing cobalt-containing films (e.g., cobalt, cobalt oxide, cobalt nitride, cobalt silicide film etc.).

Examples of cobalt precursor compounds include, but are not limited to, (alkyne) dicobalt hexacarbonyl compounds.

Examples of surfaces for deposition of metal-containing films include, but are not limited to, metals, metal oxides, metal nitrides, metal silicides, silicon, silicon oxide, and silicon nitride.

Examples of cobalt-containing films include, but are not limited to, cobalt, cobalt oxide, cobalt silicide and cobalt nitride.

One aspect of the current invention are cobalt compounds such as (alkyne) dicobalt hexacarbonyl compounds with the formula $Co_2(CO)_6$ ($R_1C\equiv CR_2$); where $R_1$ is a tertiary alkyl group and $R_2$ is selected from a group consisting of linear hydrocarbons, branched hydrocarbons, and combinations thereof.

In one embodiment of the current invention, the alkyl groups on the alkyne ligand are chosen in order to lower the melting point of the Co film precursor. The Co film precursor is liquid at the delivery temperature, more preferably at ambient temperature, and most preferably at a temperature equal and less than 30° C.

In another embodiment of the current invention, the Co film precursor is a liquid at ambient temperature.

In one embodiment of the current invention, the alkyl groups on the alkyne ligand are chosen in order to lower the Ligand Dissociation Energy (LDE).

In another embodiment of the current invention, the alkyl groups on the alkyne ligand are chosen in order to inhibit polymerization of the alkyne ligands during the Co film deposition process.

In another embodiment of the current invention, (alkyne) dicobalt carbonyl compounds are synthesized by the reaction of alkynes with dicobalt octacarbonyl in a suitable solvent (e.g. hexanes, tetrahydrofuran, diethyl ether, toluene).

The (alkyne) dicobalt carbonyl compounds can be purified by distillation under reduced pressure. Alternatively, (alkyne) dicobalt hexacarbonyl compounds can be purified by chromatography on a support such as alumina or silica. Solid (alkyne) dicobalt carbonyl compounds can be purified by sublimation under reduced pressure.

One embodiment of the current invention is (alkyne) dicobalt hexacarbonyl compounds with the formula $Co_2(CO)_6(R_1C\equiv CR_2)$; where $R_1$ is a tertiary alkyl group and $R_2$ is a linear alkyl group with at least two carbon atoms. Examples of tertiary alkyl groups are, but not limited to, tert-butyl and tert-amyl. Examples of linear alkyl groups with at least two carbon atoms are, but not limited to, n-ethyl, n-propyl, n-butyl, n-pentyl, n-hexyl, n-pentyl, and n-hexyl.

The combination of $R_1$ and $R_2$ groups is selected to lower melting point of the desired cobalt complex. The combination of $R_1$ and $R_2$ groups is also selected to provide liquid (alkyne) dicobalt hexacarbonyl compounds with improved thermal stability. While liquid (alkyne) dicobalt hexacarbonyl precursors are known in the art, for example CCTBA, these precursors have limited thermal stability. Thermal gravimetric analysis is often used to compare non-volatile residue formed during evaporation of volatile precursors.

FIG. 1 displays an overlay of thermogravimetric analysis (TGA) data for a mono-substituted alkyne cobalt complex, (3,3-Dimethyl-1-butyne)dicobalt hexacarbonyl (CCTBA), and a series of di-substituted alkyne cobalt complexes, (tert-butyl R alkyne)dicobalt hexacarbonyl, where R=methyl (CCTMA), n-propyl (CCTPA), n-butyl (CCTNBA), and n-hexyl (CCTHA) measured under flowing nitrogen.

The TGA analysis in FIG. 1 shows that CCTMA, CCTPA and CCTNBA have lower non-volatile residue compared to CCTBA and are more thermally stable precursors.

The precursors where $R_1$ is a tertiary alkyl group and $R_2$ is a linear alkyl group have lower non-volatile residue compared to CCTBA at the same temperature. The only precursor with similar higher non-volatile residue compared to CCTBA is CCTHA, however this precursor evaporates at ~50 degrees Celsius higher temperature compared to CCTBA due to its lower vapor pressure. Thus, it still has better thermal stability compare to CCTBA since the same non-volatile residue is observed even though the end point of evaporation is shifted by 50 degrees Celsius to higher temperature. Differential scanning calorimetry is often used to compare the onset of thermal decomposition of precursors.

Figure 3:
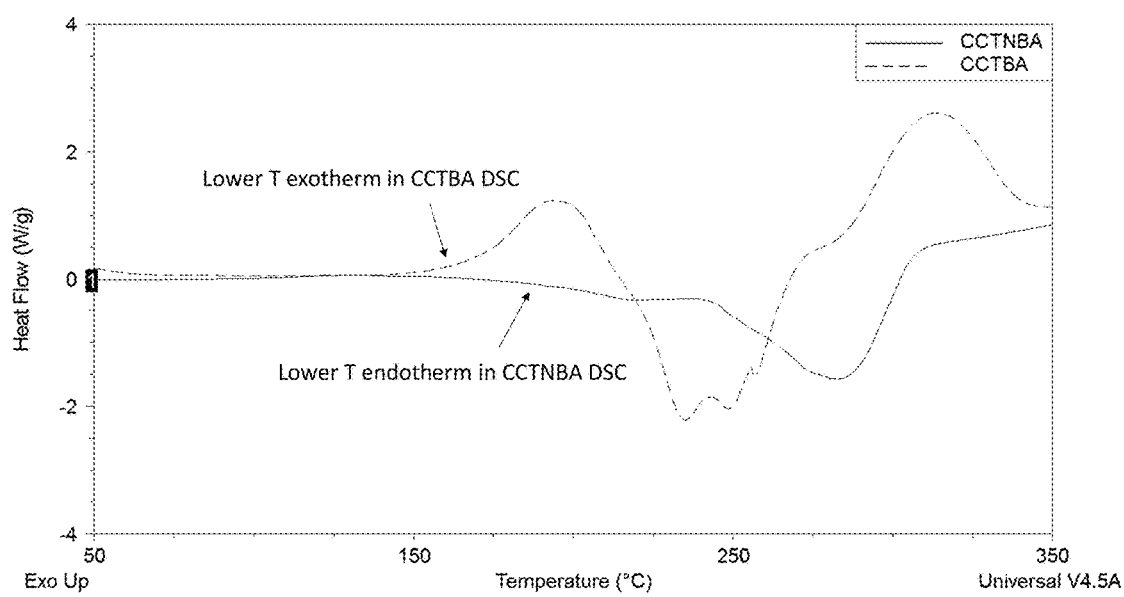
FIG. 3 shows the comparison of differential scanning calorimetry (DSC) data for (3,3-Dimethyl-1-butyne)dicobalt hexacarbonyl (CCTBA) and (2,2-Dimethyl-3-octyne) dicobalt hexacarbonyl (CCTNBA) measured in a sealed SS316 DSC pan.

FIG. 3 shows the comparison of differential scanning calorimetry (DSC) data for (3,3-Dimethyl-1-butyne)dicobalt hexacarbonyl (CCTBA) and (2,2-Dimethyl-3-octyne) dicobalt hexacarbonyl (CCTNBA) measured in a sealed SS316 DSC pan.

FIG. 3 shows that liquid precursor of this invention, CCTNBA, has higher decomposition temperature onset compared to CCTBA. The comparison shows that CCTBA decomposes exothermically at lower temperature, while CCTNBA decomposes endothermically at higher temperature, resulting in improved thermal stability of CCTNBA compared to CCTBA.

Thermal stability of precursors is extremely important for reliable delivery of the precursors to deposition tool. Since CCTBA shows non-volatile residue during evaporation and exothermic decomposition at relatively low temperature, its evaporation from the bubbler results in accumulation of non-volatile residue in the bubbler and low utilization of CCTBA in the bubbler. Precursors of current invention are expected to provide much better utilization in the bubbler and better shelf life on the deposition tool compared to CCTBA.

The reaction of 4,4-Dimethyl-2-pentyne with dicobalt octacarbonyl results in the displacement of two CO ligands and formation of a dicobalt compound with a bridging 4,4-Dimethyl-2-pentyne ligand. The chemical structure of the bridging 4,4-Dimethyl-2-pentyne ligand shows that the ligand has a tert-butyl group on one side of the carbon-carbon triple bond and a methyl group on the other side of the carbon-carbon triple bond:

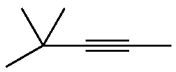

The (4,4-Dimethyl-2-pentyne) dicobalt hexacarbonyl complex (CCTMA) has the following structure:

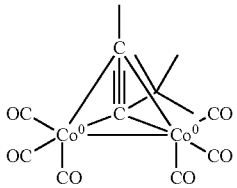

The (4,4-Dimethyl-2-pentyne) dicobalt hexacarbonyl complex is a solid at ambient temperature. The melting point of (4,4-Dimethyl-2-pentyne) dicobalt hexacarbonyl is approximately 160° C., which is not a suitable delivery temperature.

Differential Scanning calorimetry (DSC) data for (4,4-Dimethyl-2-pentyne) dicobalt hexacarbonyl shows that the onset of thermal decomposition occurs in the temperature range of 180-200° C. Therefore, it is not possible to deliver (4,4-Dimethyl-2-pentyne) dicobalt hexacarbonyl to a Co film deposition process with the Co film precursor in the liquid state.

In an example, the reaction of 2,2-Dimethyl-3-octyne with dicobalt octacarbonyl results in the displacement of two CO ligands and formation of a dicobalt compound with a bridging 2,2-Dimethyl-3-octyne ligand. The chemical structure of the bridging 2,2-Dimethyl-3-octyne ligand shows that the ligand has a tert-butyl group on one side of the carbon-carbon triple bond and a n-butyl group on the other side of the carbon-carbon triple bond:

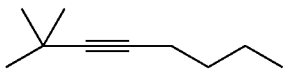

The resulting volatile (2,2-Dimethyl-3-octyne) dicobalt hexacarbonyl complex can be distilled under vacuum to yield a dark red oil. This Co film precursor is a liquid at room temperature and can be delivered to a Co film deposition process with the Co film precursor in the liquid state. The melting point of (2,2-Dimethyl-3-octyne) dicobalt hexacarbonyl is <−20° C.

In another example, the reaction of 2,2,6-Trimethyl-3-heptyne with dicobalt octacarbonyl results in the displacement of two CO ligands and formation of a dicobalt compound with a bridging 2,2,6-Trimethyl-3-heptyne ligand. The chemical structure of the bridging 2,2,6-Trimethyl-3-heptyne ligand shows that the ligand has a tert-butyl group on one side of the carbon-carbon triple bond and a iso-butyl group on the other side of the carbon-carbon triple bond:

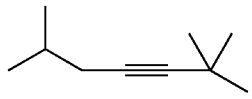

The (2,2,6-Trimethyl-3-heptyne) dicobalt hexacarbonyl complex is a solid at ambient temperature. The melting point of (2,2,6-Trimethyl-3-heptyne) dicobalt hexacarbonyl is above 25° C.

Therefore, even minimal changes of the structure of the alkyne ligand, such as changing a n-butyl group to an iso-butyl group, has an effect on the melting point of the (alkyne) dicobalt hexacarbonyl.

The melting point of (tert-butyl n-alkyl acetylene) dicobalt hexacarbonyl complexes generally decreases as the number of carbon atoms increases. However, as shown in Table I, the effect of the number of carbon atoms vs. melting point is non-linear.

TABLE I

Melting points of a series of (tert-butyl n-alkyl acetylene) dicobalt hexacarbonyl complexes.

| Alkyne ligand | Melting point (° C.) |
| --- | --- |
| 4,4-Dimethyl-2-pentyne | 160 |
| 2,2-Dimethyl-3-heptyne | 110 |
| 2,2-Dimethyl-3-octyne | <−20 |
| 2,2-Dimethyl-3-decyne | <−20 |

The cobalt complexes or compositions described herein are highly suitable for use as volatile precursors for ALD, CVD, pulsed CVD, plasma enhanced ALD (PEALD) or plasma enhanced CVD (PECVD) for the manufacture of semiconductor type microelectronic devices. Examples of suitable deposition processes for the method disclosed herein include, but are not limited to, cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the cobalt containing films are deposited via atomic layer deposition (ALD), plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the metal-containing film is deposited using an ALD process. In another embodiment, the metal-containing film is deposited using a CCVD process. In a further embodiment, the metal-containing film is deposited using a thermal CVD process. The term "reactor" as used herein, includes without limitation, reaction chamber or deposition chamber.

In certain embodiments, the method disclosed herein avoids pre-reaction of the metal precursors by using ALD or CCVD methods that separate the precursors prior to and/or during the introduction to the reactor.

In certain embodiments, the process employs a reducing agent. The reducing agent is typically introduced in gaseous form. Examples of suitable reducing agents include, but are not limited to, hydrogen gas, hydrogen plasma, remote hydrogen plasma, silanes (i.e., diethylsilane, ethylsilane, dimethylsilane, phenylsilane, silane, disilane, aminosilanes, chlorosilanes), boranes (i.e., borane, diborane), alanes, germanes, hydrazines, ammonia, or mixtures thereof.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, and mixtures thereof. In certain embodiments, a purge gas such as Ar is supplied into the reactor at a flow rate ranging from about 10 to about 2000 sccm for about 0.1 to 10000 seconds, thereby purging the unreacted material and any byproduct that may remain in the reactor.

Energy may be applied to the at least one of the precursor, reducing agent, other precursors or combination thereof to induce reaction and to form the metal-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The cobalt precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. The precursor compositions described in this application can be effectively used as source reagents in DLI mode to provide a vapor stream of these cobalt precursors into an ALD or CVD reactor.

In certain embodiments, these compositions include those utilizing hydrocarbon solvents which are particularly desirable due to their ability to be dried to sub-ppm levels of water. Exemplary hydrocarbon solvents that can be used in the present invention include, but are not limited to, toluene, mesitylene, cumene (isopropylbenzene), p-cymene (4-isopropyl toluene), 1,3-diisopropylbenzene, octane, dodecane, 1,2,4-trimethylcyclohexane, n-butylcyclohexane, and decahydronaphthalene (decalin). The precursor compositions of this application can also be stored and used in stainless steel containers. In certain embodiments, the hydrocarbon solvent in the composition is a high boiling point solvent or has a boiling point of 100° C. or greater. The cobalt precursor compositions of this application can also be mixed with other suitable metal precursors, and the mixture used to deliver both metals simultaneously for the growth of a binary metal-containing films.

In certain embodiments, the gas lines connecting from the precursor canisters to the reaction chamber are heated to one or more temperatures depending upon the process requirements and the container comprising the composition is kept at one or more temperatures for bubbling. In other embodiments, a composition cobalt precursor is injected into a vaporizer kept at one or more temperatures for direct liquid injection.

A flow of argon and/or other gas may be employed as a carrier gas to help deliver the vapor of the at least one cobalt precursor to the reaction chamber during the precursor pulsing. In certain embodiments, the reaction chamber process pressure is between 1 and 50 torr, preferably between 5 and 20 torr.

For many applications, high purity Co metal films are a requirement for reasons including, but not limited to, low resistivity. It is widely known in the art that certain impurities in the Co metal film can increase resistivity. These impurities include, but are not limited to, carbon, oxygen, and nitrogen. Therefore, suitable Co metal deposition precursors must be designed to limit the amount of carbon present in the deposited Co metal films.

Cobalt compounds with the structure (alkyne)dicobalt hexacarbonyl have been studied for use as Co deposition precursors. C. Georgi et al. (J. Mater. Chem. C, 2014, 2, 4676-4682) teaches that despite wide variation in the identity of $R_1$ and $R_2$ groups in complexes with the formula $Co_2(CO)_6$ ($R_1C{\equiv}CR_2$); where $R_1$ or $R_2$ can be tertiary (e.g. trimethylsilyl), linear (e.g. n-propyl), or hydrogen, there are high levels of both carbon and oxygen in the bulk films. Carbon contents range from 2.5-36.5 mol. % and oxygen contents range from 0.8-34.4 mol. % in this study. The lowest amount of carbon in this series was 2.5 at. % for solid precursor with high melting point where $R_1$ and $R_2$ are trimethylsilyl. Thus, the amount of carbon in the cobalt film deposited using these precursors was similar to the amount of carbon in the cobalt film deposited from CCTBA, described by Keunwoo Lee et al. in Japanese Journal of Applied Physics, 2008, Vol. 47, No. 7, 5396-5399.

Carbon and oxygen content in the deposited film should preferably be <2.5 at. %, or more preferably, <1.5 at. %, and most preferably, <0.5 at. %. Low carbon content in the film can yield cobalt metal films with low resistivity without the need for post-deposition treatments such as exposure of the films to hydrogen or ammonia plasma.

Substrate temperature is an important process variable in the deposition of high quality cobalt films. Typical substrate temperatures range from about 100° C. to about 250° C. Higher temperatures can promote higher film growth rates. It therefore desirable to find Co film precursors that can deposit Co films at high temperatures without increasing the level of impurities such as carbon and oxygen.

It is generally accepted in the art of metal-containing film deposition that precursors which are liquid under the metal-containing film deposition process conditions are preferred vs. precursors which are solids under the metal-containing film deposition process conditions. Reasons include, but are not limited to, the ability to bubble carrier gas through the metal-containing film precursor under suitable process conditions. The ability to bubble carrier gas through the metal-containing film precursor can result in more uniform delivery of precursor to the metal-containing film deposition process vs. sublimation of solid precursors.

Unexpectedly, we have found that precursors of this invention, (alkyne) dicobalt hexacarbonyl compounds with the formula $Co_2(CO)_6(R_1C\equiv CR_2)$; where $R_1$ is a tertiary alkyl group and $R_2$ is selected from a group consisting of linear hydrocarbons, branched hydrocarbons, and combinations thereof, provide cobalt films with carbon levels as low as 0.4 at %. Without being bound by theory it is believed that bulky tertiary alkyl group $R_1$ is required to lower alkyne ligand dissociation energy from cobalt center, thus resulting in cleaner removal of organic ligand from cobalt center. Thus, it would be expected that a Co film precursor such as (2,2-Dimethyl-3-octyne) dicobalt hexacarbonyl (Cobalt Carbonyl Tert-butyl N-Butyl Acetylene, CCTNBA) would display low carbon levels in the deposited films.

As an example, the ligand dissociation energies for alkyne ligand removal and CO ligand removal were calculated for a series of (alkyne) dicobalt hexacarbonyl compounds. Using BioViaMaterials Studio 7.0 (BLYP/DNP/AE, 4.4 Angstrom orbital cutoff) for calculation of reaction energetics at 0 K and with manual spin state optimization, Table II shows the calculated reaction energetics for the removal of alkyne ligands and CO ligands from a series of (alkyne) dicobalt hexacarbonyl complexes. Table II reveal strong steric effects for the alkyl groups on the alkyne ligand.

TABLE II

Calculated reaction energetics for the removal of alkyne ligands and CO ligands

|  | CCTBA | CCMPA | CCTMA | CCBTA | CCNBA |
| --- | --- | --- | --- | --- | --- |
| Alkyne Ligand Removal | +1.4 | +8.0 | +4.3 | +1.8 | +9.5 |
| CO Ligand Removal | +15.7 | +18.3 | +16.9 | +16.2 | +16.5 |

* Energies are shown in kcal/mol.
* CCTBA: (tert-butylacetylene)dicobalt hexacarbonyl/(tBu)CCH(Co)$_2$(CO)$_6$
* CCMPA: (methylpropylacetylene)dicobalt hexacarbonyl/(iPr)CC(Me)(Co)$_2$(CO)$_6$
* CCTMA: (tert-butylmethylacetylene)dicobalt hexacarbonyl/(tBu)CC(Me)(Co)$_2$(CO)$_6$
* CCBTA: [bis(tert-butyl)acetylene]dicobalt hexacarbonyl/(tBu)CC(tBu)(Co)$_2$(CO)$_6$
* CCNBA: (n-butylacetylene)dicobalt hexacarbonyl/(nBu)CCH(Co)$_2$(CO)$_6$ Table II illustrates the significant impact of steric bulk on the alkyne ligand dissociation energies (LDE). For example, the LDE for the alkyne ligand in CCNBA is significantly higher than the LDE for the alkyne ligand in isomeric CCTBA. Furthermore, the number of functional groups on a ligand can alter the LDE for the alkyne ligands. For linear alkyl groups, the calculations shown in Table II suggest a modest decrease in the LDE for a (di-substituted alkyne) dicobalt hexacarbonyl complex, CCMPA, vs. a (mono-substituted alkyne) dicobalt hexacarbonyl complex, CCNBA.

Without being bound by theory it is believed that $R_2$ is selected from a group consisting of linear hydrocarbons, branched hydrocarbons, and combinations thereof, provided improved thermal stability to this family of the precursors. For example, one of potential CCTBA decomposition routes is via oligomerization of the mono-substituted alkyne ligand, tert-butylacetylene. Di-substitiuted acetylenes of the current invention are expected to have a lower oligomerization rate. This property is beneficial to avoid accumulation of decomposition by-products during precursor delivery. In another embodiment, cobalt-containing films are deposited using $Co_2(CO)_6(R_1C\equiv CR_2)$; where $R_1$ is a tertiary alkyl group and $R_2$ is a linear alkyl group with at least two carbon atoms or $R_2$ is isopropyl or isobutyl. Examples of tertiary alkyl groups are, but not limited to, tert-butyl and tert-amyl. Examples of linear alkyl groups with at least two carbon atoms are, but not limited to, n-ethyl, n-propyl, n-butyl, n-pentyl and n-hexyl. (2,2-Dimethyl-3-octyne) dicobalt hexacarbonyl (CCTNBA) is a preferred precursor since it is a liquid at room temperature with relatively high vapor pressure and good thermal; stability. Cobalt films can be grown onto silicon, silicon oxide, PVD TaN and copper substrates using the disclosed Co complexes as deposition precursors in a reactor.

Co film thickness can be measured by X-ray fluorescence (XRF), scanning electron microscopy (SEM), and transmission electron microscopy (TEM).

In certain embodiments, precursors with disubstitiuted alkyne ligands are used to selectively deposit a cobalt-containing film on conductive metal surface vs. dielectric surfaces Conductive metal surfaces may comprise copper, cobalt and ruthenium. The conductive metal surface can be pre-treated prior to the deposition process to remove contaminants from the conductive metal surface. Contaminants may include organic impurities and metal oxides. The pre-treatment process may comprise heating a structure comprising a conductive metal surface in the presence of a reducing gas, such as, for example, hydrogen or ammonia, at 100-500° C. and/or exposing a structure comprising a conductive metal surface to a hydrogen plasma, ammonia plasma, nitrogen plasma, argon plasma or helium plasma at 100-500° C.

Dielectric surfaces may comprise silicon dioxide, fluorosilicate glass (FSG), organosilicate glass (OSG), carbon doped oxide (CDO), or porous low-K materials. Examples of low K dielectric materials used in the process include porous OSG (organosilicate glass).

The structures comprising conductive metal surfaces and dielectric surfaces may comprise:

a) at least one patterned dielectric layer with embedded conductive metal features (such as copper, cobalt, ruthenium or metal alloys); and b) a cobalt layer selectively deposited at least on the conductive metal features.

The structure can further have a metal barrier layer formed between the patterned dielectric layer and embedded conductive metal features. The metal barrier layer comprises materials such as tantalum, tantalum nitride, titanium, titanium nitride, cobalt, ruthenium, and other advanced barrier materials which prevent diffusion of the copper into the dielectric material.

The selectivity can be measured by comparing the thickness of the cobalt-containing film deposited on copper and silicon oxide under the same process conditions. The ratio of the cobalt-containing film thickness on copper vs. silicon oxide is preferably >10:1, more preferably >50:1, and most preferably >250:1 as measured by XRF, SEM, or TEM.

In one embodiment, the cobalt films deposited from the cobalt precursors of the current invention are annealed in order to lower the resistivity of the films. In the annealing process the structures comprising cobalt films are heated to 300-500° C., preferably to 375-425° C. in the flow of a gas comprising 3-15 vol. % of hydrogen.

WORKING EXAMPLES

The following examples have shown the method of making disclosed Co complexes and deposition of Co-containing films using disclosed Co complexes as Co precursors.

In the deposition process, Co precursors were delivered to the reactor chamber by passing 50 sccm argon via stainless steel containers filled with Co precursor. Container temperature varied from 30° C. to 60° C. to achieve sufficient vapor pressure of the precursor. Wafer temperature varied between from 125° C. and 200° C. Reactor chamber pressure varied from 5 to 20 torr. Deposition tests were done in the presence of 500-1000 sccm of hydrogen or argon flow. Deposition time varied from 20 seconds to 20 minutes for achieving Co films of different thickness.

Cobalt films were grown onto silicon, silicon oxide, PVD TaN and copper substrates using a CN-1 showerhead style reactor.

Co film thickness was measured by X-ray fluorescence (XRF) and scanning electron microscopy (SEM).

Example 1 (Comparative)

Synthesis and thermal properties of (methyl n-propylacetylene)dicobalt hexacarbonyl (CCMPA)/("Pr)CC(Me)(Co)$_2$(CO)$_6$ In a ventilated hood, a solution of 2-hexyne (4.34 g, 53 mmol) in hexanes (50 mL) was added over 30 minutes to a solution of Co$_2$(CO)$_8$ (17 g, 48 mmol) in hexanes (100 mL). CO evolution was observed upon addition of each aliquot of 2-hexyne solution. The resulting dark red/brown solution was stirred at room temperature for 4 hours. The volatiles were removed under vacuum at room temperature to yield a dark red oil. The oil was filtered through a pad of Celite 545 and distilled under vacuum. The product began distilling at 40° C. and ca. 200 millitorr pressure. The temperature was slowly raised to 50° C. (pressure 140 millitorr). The temperature was slowly raised to 55° C. (pressure 120 millitorr). The temperature remained at 55° C. until the conclusion of the distillation. A very small amount of black solid coated the reboiler after all of the volatile CCMPA was evaporated. The resulting dark red oil was analyzed by IR, NMR, TGA, and DSC.

Solution IR of neat CCMPA showed ca. 0.07% Tetracobalt dodecacarbonyl (1860 cm-1) and no other substantial metal carbonyl peaks.

The $^1$H NMR spectrum of CCMPA displayed four sets of resonances with the expected 2/3/2/3 intensity matching the molecular structure [2.5 ppm (m), 2H; 2.3 ppm (s), 3H; 1.5 ppm (m), 2H; 0.8 ppm (m), 3H].

Dynamic thermogravimetric analysis (TGA) of CCMPA was measured under flowing nitrogen.

There appeared to be a change in the evaporation rate at ca. 155° C. that possibly indicated the formation of a less volatile decomposition product. The final non-volatile residue weight was 3.1% of the original weight.

Example 2 (Comparative)

Deposition of Co Films from CCMPA

The Co precursor, CCMPA, was synthesized and purified as described in Comparative Example 1. The experimental conditions for cobalt film deposition were: precursor container temperature 35° C., wafer temperature 150° C., chamber pressure 10 torr, and hydrogen flow rate 500 sccm.

Cobalt film thickness and film properties in comparison to films deposited using the same conditions but using CCTBA as precursor are shown in Table III. Deposition time was 10 min. for both precursors.

TABLE III

| Property | CCMPA | CCTBA |
| --- | --- | --- |
| Film thickness, A | 213 | 424 |
| Carbon, at. % | 28.2 | 6.2 |
| Oxygen, at. % | 1.4 | 0.8 |

Increasing deposition temperature to 175° C. resulted in higher impurities for both precursors. Thus, this comparative example demonstrates that the Co$_2$(CO)$_6$(nPrC≡CMe) precursor where R$_1$ and R$_2$ are not a tertiary alkyl group provided a cobalt film with an amount of carbon (28.2 at %) significantly higher than a cobalt film using CCTBA precursor.

Example 3

Synthesis and termal properties of(tert-butylmethylacetylene) dicobalt hexacarbonyl (CCTMA)/(tBu)CC(Me)(Co)$_2$(CO)$_6$ In a ventilated hood, a solution of 4,4-Dimethyl-2-pentyne (5 g, 52 mmol) in hexanes (50 mL) was added over 30 minutes to a solution of Co$_2$(CO)$_8$ (17.0 g, 48 mmol) in hexanes (150 mL). CO evolution was observed upon addition of each aliquot of 4,4-Dimethyl-2-pentyne solution. The resulting dark red/brown solution was stirred at room temperature for 4 hours. The volatiles were removed under vacuum at room temperature to yield a dark brown solid. The solid was dissolved in ~25 mL of hexanes and filtered through a pad of Celite 545. Upon removal of the hexanes under vacuum, a dark reddish-brown solid was obtained. The solid was purified by sublimation under vacuum at 35° C. (0.6 mTorr).

Solution IR analysis (10% hexane solution) showed one peak for carbonyl ligands with no peaks corresponding to dicobalt octacarbonyl starting material.

The $^1$H NMR spectrum of CCTMA displayed two sets of resonances with the expected 1:3 intensity matching the molecular structure [2.3 ppm (s), 1 H; 1.1 ppm (s), 3H].

Dynamic thermogravimetric analysis (TGA) of CCTMA was measured under flowing nitrogen and shown in FIG. 1 along with data for other cobalt complexes in the current invention.

There appeared to be an increase in the evaporation rate at ca. 160° C. that possibly indicated a melting point.

The final non-volatile residue weight was 0.6% of the original weight. Differential scanning calorimetry of a CCTMA sample verified a melting point of ~160° C.

Example 4

Preparation of (2,2-Dimethyl-3-heptyne)dicobalt hexacarbonyl (Cobalt Carbonyl Tert-butyl Propyl Acetylene—CCTPA)

In a well-ventilated hood, a solution of 2,2-Dimethyl-3-heptyne (5 g, 40 mmol) in hexanes (25 mL) was added over 30 minutes to a solution of $Co_2(CO)_8$ (12.3 g, 36 mmol) in hexanes (75 mL). CO evolution was observed upon addition of each aliquot of 2,2-Dimethyl-3-heptyne solution. The resulting dark reddish-brown solution was stirred at room temperature for 16 hours. The volatiles were removed under vacuum at room temperature to yield a dark brown mixture of solids and liquid. The solid/liquid mixture was dissolved in ~50 mL of hexanes and filtered through a pad of Celite 545. Upon removal of the hexanes under vacuum, a dark brown mixture of solids and liquid was obtained. The crude material was dissolved in 10 mL of hexanes. A chromatography column (~3 cm in diameter) was packed with 8 inches of neutral activated alumina using pure hexanes as the eluent. The crude material solution was placed on the column and eluted using hexanes. A dark brown band remained on the top of the column while a bright red band quickly moved down the column with the hexanes. The red band was collected and evacuated to dryness, yielding a sticky dark red solid.

$^1H$ NMR and $^{13}C$ NMR analysis of the solid shows resonances consistent with the expected product.

IR analysis in hexane solution showed two strong bands for the metal-bound CO ligands at 2050 and 2087 $cm^{-1}$.

Example 5

Synthesis of 2,2-Dimethyl-3-decyne (tert-butyl n-hexyl acetylene)

In a nitrogen glovebox, a solution of tert-butylacetylene (3,3-Dimethyl-1-butyne) was prepared by placing tert-butylacetylene (5.0 g, 61 mmol) in a 500 mL Schlenk flask with 100 mL of anhydrous THF. To a 60 mL addition funnel was added 24 mL of 2.5 M n-Butyllithium in hexanes (60 mmol). The flask and addition funnel were removed from the glovebox and assembled in a ventilated hood. The tert-butylacetylene solution was cooled to 0° C. The n-Butyllithium solution was added dropwise to the tert-butylacetylene solution over 20 minutes with stirring. After the addition was complete, the colorless solution was allowed to warm to room temperature over two hours with stirring. The resulting solution was cooled to 0° C. To a 60 mL addition funnel was added 1-Iodohexane (11.4 g, 54 mmol) and 40 mL anhydrous THF. This solution was added dropwise to the cooled lithium tert-butylacetylide solution over 30 minutes with stirring. The solution was allowed to warm to room temperature and was stirred at room temperature for 2.5 days. The resulting colorless solution was sampled by GC-MS, showing ~95% yield of the desired product. Under nitrogen, deionized water (100 mL) was added to the solution, forming a two-phase mixture. An additional 100 mL of hexanes was then added to the two-phase mixture to promote phase separation. After 10 minutes of stirring, the two phases were separated. The organic layer was extracted with a second 100 mL aliquot of deionized water before separation. The two water washes were combined and extracted with 50 mL of hexanes. The organic fractions were combined and dried by stirring over anhydrous magnesium sulfate for 30 minutes. The magnesium sulfate was removed by filtering through a glass frit. The resulting clear, colorless solution was distilled under static vacuum to remove the solvents. While holding the reboiler temperature at 20° C., the condenser at −10° C., and the collection flask at −78° C. (dry ice), the distillation apparatus was evacuated to ~10 torr and isolated from the vacuum line by closing a valve. The solvents were removed over ~1.5 hours, leaving ~10 cc of colorless liquid in the reboiler. The collection flask was removed and another, smaller collection flask was installed. This flask was cooled to −78° C. and the condenser temperature was set to ~2° C. Approximately half of the remaining liquid was transferred to the collection flask under dynamic vacuum (~1 torr).

GC-MS analysis showed that the 2,2-Dimethyl-3-decyne was isolated in >99% purity.

Example 6

Synthesis of (2,2-Dimethyl-3-decyne) dicobalt hexacarbonyl (Cobalt Carbonyl Tert-butyl n-Hexyl Acetylene 13 CCTHA)

In a ventilated hood, a solution of 2,2-Dimethyl-3-decyne (4.15 g, 25 mmol) in hexanes (25 mL) was added over 30 minutes to a solution of $Co_2(CO)_8$ (7.85 g, 23 mmol) in hexanes (75 mL). Modest CO evolution was observed upon addition of each aliquot of 2,2-Dimethyl-3-decyne solution. The resulting dark reddish-brown solution was stirred at room temperature for 4 hours. The volatiles were removed under vacuum at room temperature to yield a dark red liquid with some suspended solids. A chromatography column (~3 cm in diameter) was packed with 10 inches of neutral activated alumina using pure hexanes as the eluent. Five mL of the neat crude material was placed on the column and eluted using hexanes. A reddish-brown band quickly moved down the column with the hexanes. A small amount of dark material remained at the top of the column. The reddish-brown band was collected and evacuated to ~500 mTorr, yielding a dark red liquid.

$^1H$ NMR analysis of the purified CCTHA sample (d8-toluene): 2.66 (m), 1.61 (m), 1.23 (m), 1.17 (s), 0.86 (t).

Example 7

Synthesis of 2,2,6-trimethyl-3-heptyne (tert-butyl iso-butyl acetylene)

In a nitrogen glovebox, a solution of tert-butylacetylene (3,3-Dimethyl-1-butyne) was prepared by placing tert-butylacetylene (5.0 g, 61 mmol) in a 250 mL Schlenk flask with 100 mL of anhydrous THF. To a 60 mL addition funnel was added 24 mL of 2.5 M n-Butyllithium in hexanes (60 mmol). The flask and addition funnel were removed from the glovebox and assembled in a ventilated hood. The tert-butylacetylene solution was cooled to 0° C. The n-Butyllithium solution was added dropwise to the tert-butylacetylene solution over 20 minutes with stirring. After the addition was complete, the pale yellow solution was allowed to warm to room temperature over two hours with stirring. The resulting solution was cooled to 0° C. To a 60 mL addition funnel was added 1-iodo-2-methylpropane (9.9 g, 54 mmol) and 20 mL anhydrous THF. This solution was added dropwise to the cooled lithium tert-butylacetylide solution over 30 minutes with stirring. The color changed from pale yellow to colorless during the addition. The solution was allowed to warm to room temperature and was stirred at room temperature for 2 days. GC-MS analysis showed nearly complete conversion to the expected product. The solution was extracted with deionized water (2×100 mL). The water washes were extracted with 50 mL of hexanes. The organic fractions were combined and dried over anhydrous magnesium sulfate for 30 minutes. The solvent was removed by distillation at reduced pressure (~10 torr). The remaining colorless liquid was distilled under vacuum (~500 mTorr) into a receiver cooled to –78 oC.

GC-MS analysis of the product showed that the product was collected with >98% purity.

Example 8

Synthesis of (2,2,6-Trimethyl-3-heptyne) dicobalt hexacarbonyl (Cobalt Carbonyl Tert-butyl Iso-Butyl Acetylene—CCTIBA)

In a ventilated hood, a solution of 2,2,6-Trimethyl-3-heptyne (0.95 g, 6.6 mmol) in hexanes (15 mL) was added over 20 minutes to a stirred solution of $Co_2(CO)_8$ (2.1 g, 6.2 mmol) in hexanes (45 mL). Modest CO evolution was observed upon addition of the 2,2,6-Trimethyl-3-heptyne solution. The resulting dark brown solution turned dark red over the course of four hours of stirring at room temperature. The volatiles were removed to yield a dark brown solid. 5 mL of hexanes were added to yield a dark reddish-brown liquid with some suspended solids. A chromatography column (~3 cm in diameter) was packed with 8 inches of neutral activated alumina using pure hexanes as the eluent. The crude material was placed on the column and eluted using hexanes. A brown band quickly moved down the column with the hexanes. A small amount of dark purple material was retained in the top 1" of the column. The reddish-brown band was collected and evacuated to base vacuum on a Schlenk line (~500 mTorr), yielding a dark, sticky reddish brown solid.

TGA analysis of CCTIBA by heating from room temperature to 400° C. under flowing nitrogen shows 1.3% non-volatile residue.

$^1$H NMR analysis of CCTIBA shows that the product has high purity (>99%). Chemical shifts ($d_8$-toluene): 2.55 (2H, d), 1.80 (1 H, m), 1.15 (9H, s), 0.97 (6H, d).

$^{13}$C NMR analysis of CCTIBA yields the following chemical shifts ($d_8$-toluene): 199.8, 111.6, 98.2, 41.1, 35.4, 31.0, 30.0, 22.2.

Example 9

Synthesis of 2,2-Dimethyl-3-octyne (tert-butyl n-butyl acetylene)

In a nitrogen glovebox, a solution of tert-butylacetylene (3,3-Dimethyl-1-butyne) was prepared by placing tert-butylacetylene (32.8 g, 0.4 mol) in a 1000 mL round bottom flask with 500 mL of anhydrous THF. To a 500 mL addition funnel was added 150 mL of 2.5 M n-Butyllithium in hexanes (0.375 mol). The flask and addition funnel were removed from the glovebox and assembled in the hood. The tert-butylacetylene solution was cooled to 0° C. The n-Butyllithium solution was added dropwise to the tert-butylacetylene solution over 30 minutes with stirring. After the addition was complete, the colorless solution was allowed to warm to room temperature over two hours with stirring. To a 500 mL addition funnel was added 1-Iodobutane (64.4 g, 0.35 mol) and 100 mL anhydrous THF. This solution was added dropwise to the lithium tert-butylacetylide solution over 30 minutes with stirring. The solution was stirred at room temperature for 3 days. GC-MS analysis of a small sample showed complete conversion to the product. The solution was extracted two times with 100 mL of deionized water. The water washes were extracted with 200 mL of hexane and this extract was combined with the THF/hexane solution. The organic solution was dried over magnesium sulfate for 30 minutes. During this time, the colorless solution became light yellow. The combined organic solutions were distilled at reduced pressure (~10 Torr) while holding the reboiler at 20° C., the condenser at 0° C., and the collection flask at –78° C. After the removal of solvent, another collection flask was fitted, and the remaining volatiles distilled while holding the reboiler at 25° C., the condenser at 0° C., and the collection flask at –78° C. The pressure during the second distillation was ~2 torr. When all of the volatiles had been transferred, the collection flask was allowed to warm to room temperature. The colorless liquid was analyzed using GC-MS, confirming the presence of highly pure product (>99% purity, 42.2 g, 87% yield).

$^1$H NMR analysis of 2,2-Dimethyl-3-octyne gives the following chemical shifts: 2.03 (t, 2H); 1.33 (m, 4H); 1.19 (s, 9H); 0.80 (t, 3H).

Example 10

Synthesis of (2,2-Dimethyl-3-octyne) dicobalt hexacarbonyl (Cobalt Carbonyl Tert-butyl N-Butyl Acetylene (CCTNBA)

In a ventilated hood, a solution of 2,2-Dimethyl-3-octyne (21.5 g, 0.15 mol) in hexanes (100 mL) was added over 30 minutes to a solution of $Co_2(CO)_8$ (47.5 g, 0.14 mol) in hexanes (700 mL). Visible CO evolution was observed upon addition of the 2,2-Dimethyl-3-octyne solution. The resulting dark brown solution turned dark reddish brown over the course of stirring at room temperature for four hours. The hexanes were removed using vacuum distillation while holding the reboiler at 25° C. (condenser temp. –5° C.; collection flask temp. –78° C.), to yield a dark red liquid with dark solids. A chromatography column (~3 inches in diameter) was packed with 8 inches of neutral activated alumina using pure hexanes as the eluent. The crude material was placed on the column and eluted using hexanes. A brown band quickly moved down the column with the hexanes. Dark purple material was retained in the top 2-3" of the column. The reddish-brown band was collected and evacuated on a Schlenk line (~700 mTorr), yielding 40.0 g of a dark red liquid.

$^1$H NMR analysis of CCTNBA showed high purity (NMR assay 99.6%). Chemical shifts ($d_8$-toluene): 2.66 (t, 2H), 1.60 (m, 2H), 1.29 (m, 2H), 1.17 (s, 9H), 0.86 (t, 3H).

Figure 2:
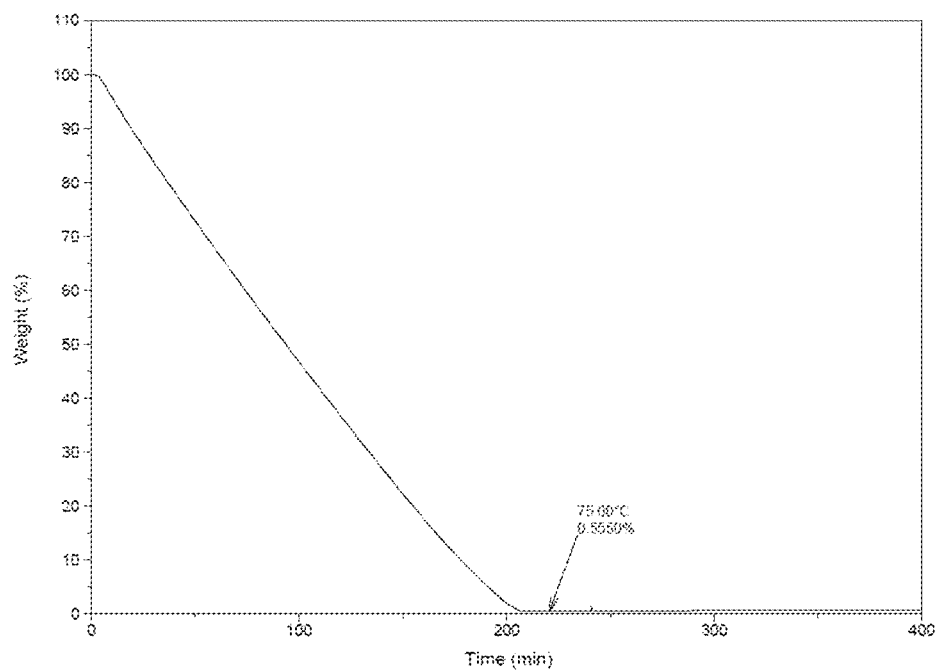
FIG. 2 shows isothermal thermogravimetric analysis (TGA) data for (2,2-Dimethyl-3-octyne) dicobalt hexacarbonyl (Cobalt Carbonyl Tert-butyl N-Butyl Acetylene-CCTNBA) measured at 75° C. under flowing nitrogen.

Isothermal TGA data for (2,2-Dimethyl-3-octyne) dicobalt hexacarbonyl (Cobalt Carbonyl Tert-butyl N-Butyl Acetylene—CCTNBA) was measured at 75° C. under flowing nitrogen and shown in FIG. 2. The complex was vaporized in ~200 minutes with a low non-volatile residue of 0.55%, confirming good thermal stability of CCTNBA precursor.

FIG. 3 shows the comparison of differential scanning calorimetry (DSC) data for (3,3-Dimethyl-1-butyne)dicobalt hexacarbonyl (CCTBA) and (2,2-Dimethyl-3-octyne) dicobalt hexacarbonyl (CCTNBA) measured in a sealed SS316 DSC pan.

Example 11

Deposition of Co Films using CCTMA

In the deposition process, CCTMA was delivered to the reactor chamber by passing 50 sccm argon via stainless steel containers filled with CCTMA. Container temperature varied from 30° C. to 60° C. to achieve sufficient vapor pressure of the CCTMA precursor. The substrate temperature was varied between from 125° C. and 200° C. Reactor chamber pressure varied from 5 to 20 torr. Deposition tests were done in the presence of 500-1000 sccm of hydrogen or argon flow. Deposition time varied from 20 seconds to 20 minutes for achieving Co films of different thickness (2-70 nm).

Figure 4:
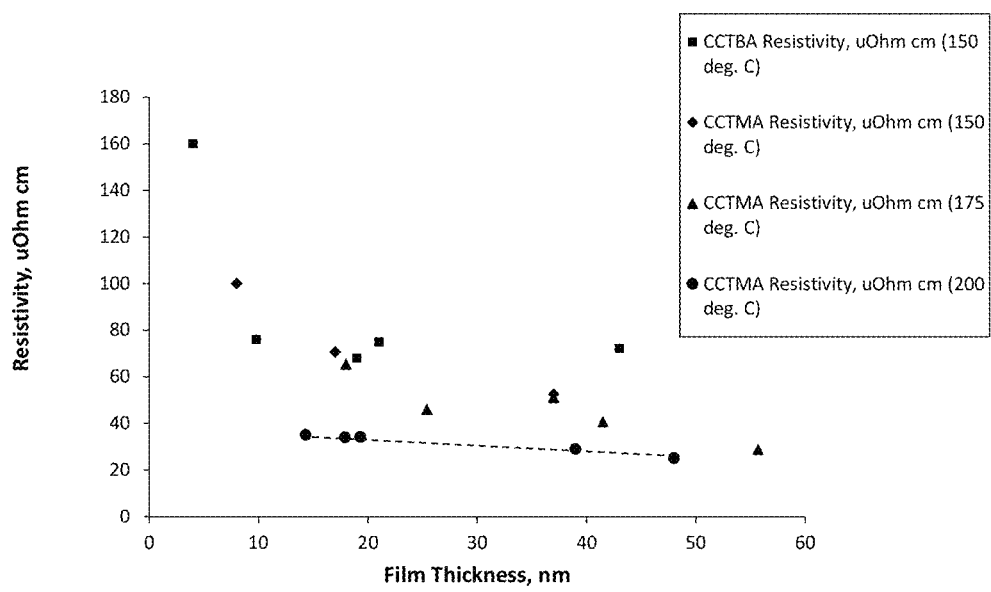
FIG. 4 shows an overlay of Co film resistivity vs. film thickness for (3,3-Dimethyl-1-butyne)dicobalt hexacarbonyl (CCTBA) and (4,4-Dimethyl-2-pentyne dicobalt hexacarbonyl (CCTMA).

FIG. 4 shows an overlay of Co film resistivity vs. film thickness for (3,3-Dimethyl-1-butyne)dicobalt hexacarbonyl (CCTBA) and (4,4-Dimethyl-2-pentyne dicobalt hexacarbonyl (CCTMA). The Co films were deposited using CCTMA and CCTBA at a substrate temperature of 150° C.

FIG. 4 indicates that as the temperature of the substrate is increased to 175° C. and 200° C., the resistivity of the Co films deposited using CCTMA decrease to a point where the resistivity of the Co films deposited using CCTMA at a substrate temperature of 200° C. are about 50% lower than the films deposited using CCTBA at a substrate temperature of 150° C. at the same film thickness. In all cases, the lower resistivity films had lower carbon content than films with high resistivity. Therefore, the resistivity of films described in the current invention are a function of the residual carbon content of the deposited films.

FIG. 4 shows that CCTMA provided Co films with much lower resistivity compared to cobalt films deposited from CCTBA.

Figure 5:
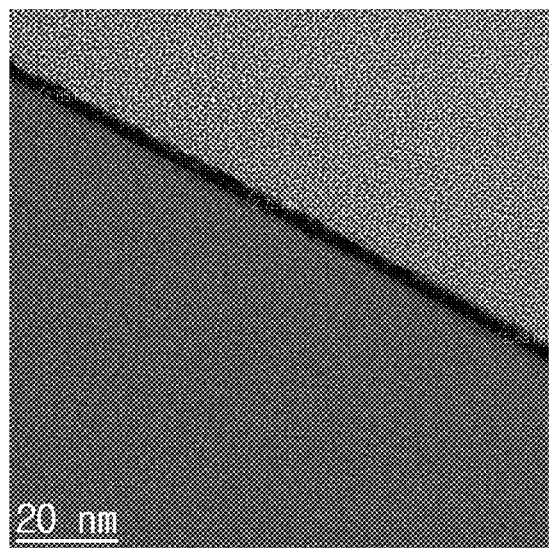
FIG. 5 shows Transmission Electron Microscopy (TEM) images of cobalt films deposited on $SiO_2$ using 4,4-Dimethyl-2-pentyne dicobalt hexacarbonyl (CCTMA) as the Co film precursor.
Figure 5:
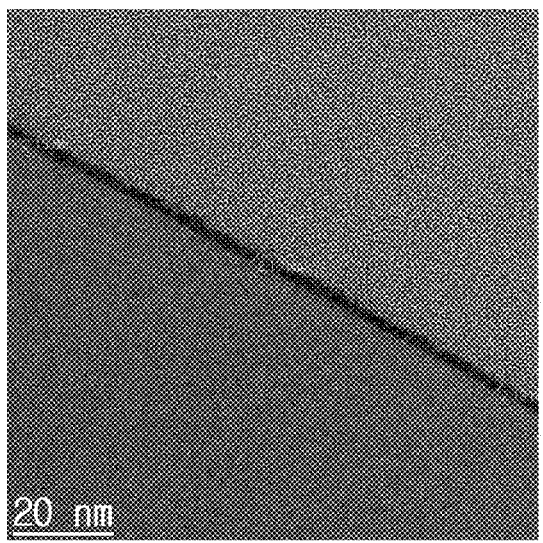

FIG. 5 shows Transmission Electron Microscopy (TEM) images of cobalt films deposited on $SiO_2$ using 4,4-Dimethyl-2-pentyne dicobalt hexacarbonyl (CCTMA) as the Co film precursor.

FIG. 5 demonstrates that continuous films of Co metal may be formed on $SiO_2$ with thicknesses as low as ~2 nm.

Films were deposited from CCTMA and CCTBA and analyzed by X-ray Photoelectron Spectroscopy (XPS) to determine elemental concentration throughout the metal films. The conditions for deposition of CCTMA were: precursor delivery temperature=50° C., wafer temperature=200° C., deposition time=10 minutes. The conditions for deposition of CCTBA were: precursor delivery temperature=35° C., wafer temperature=175° C., deposition time=3 minutes. Cobalt film deposited from CCTBA at 150° C. contained lower amount of carbon, 6.2 at. %, but the amount of carbon in the film was still significantly higher compared to amount of carbon in cobalt film deposited from CCTMA (3.7 at. %) at the same temperature.

Figure 6:
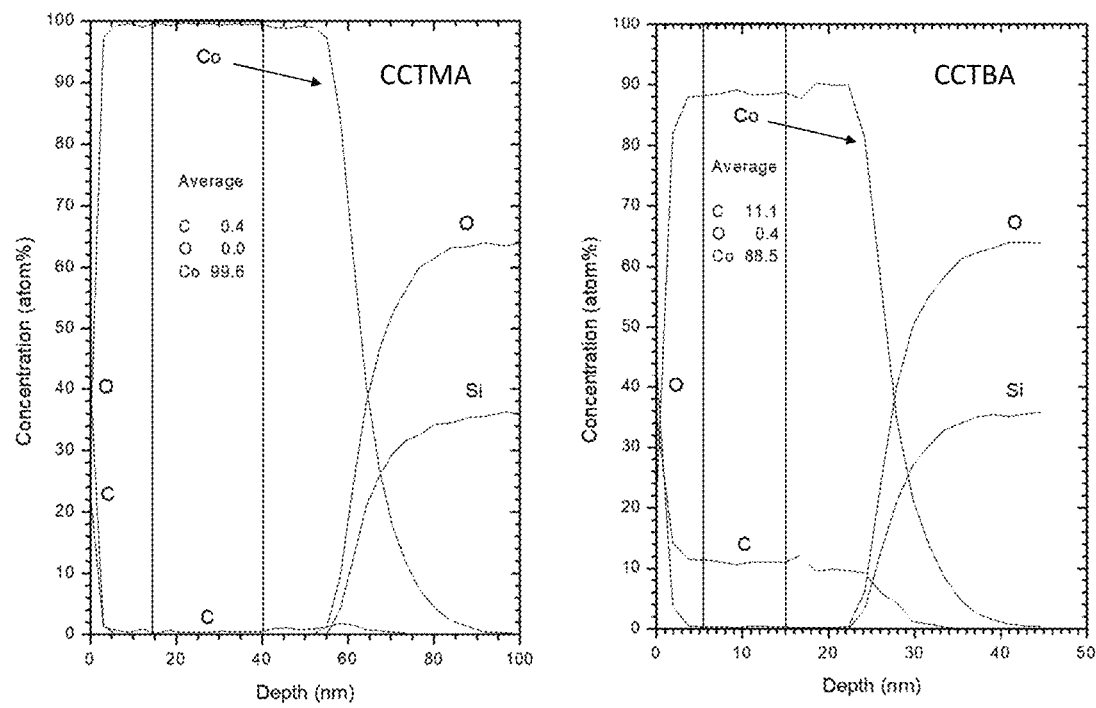
FIG. 6 shows X-ray Photoelectron Spectroscopy (XPS) data for of cobalt films deposited on $SiO_2$ using (3,3-Dimethyl-1-butyne)dicobalt hexacarbonyl (CCTBA) and 4,4-Dimethyl-2-pentyne dicobalt hexacarbonyl (CCTMA) as the Co film precursors.

FIG. 6 shows XPS data for of cobalt films deposited on $SiO_2$ using (3,3-Dimethyl-1-butyne)dicobalt hexacarbonyl (CCTBA) and 4,4-Dimethyl-2-pentyne dicobalt hexacarbonyl (CCTMA) as the Co film precursors.

FIG. 6 indicates that Co films deposited on $SiO_2$ using CCTMA as the Co film precursor have significantly lower levels of carbon, 0.4 at. %, than films deposited using CCTBA as the Co film precursor, (11.1 at. %).

The conditions of Co film deposition using CCTMA were: container temperature 50° C., wafer temperature 200° C., deposition time 10 minutes. The conditions of Co film deposition using CCTBA are: container temperature 35° C., wafer temperature 175° C., deposition time 3 minutes.

Example 12

Deposition of low resistivity Co films using CCTNBA

In the deposition process, CCTNBA was delivered to the reactor chamber by passing 50 sccm argon through stainless steel containers filled with CCTNBA. The process conditions were: container temperature 50° C., hydrogen flow 50 sccm, pressure 10 torr. The substrate temperatures ranged from 150-200° C. The substrate was $SiO_2$.

Table IV shows the dependence of film thickness on deposition time and substrate temperature.

TABLE IV

| Sub. Temperature (° C.) | Deposition Time (min.) | Co film thickness (nm) |
|---|---|---|
| 150 | 5 | 2.1 |
| 150 | 10 | 4.1 |
| 150 | 20 | 8.5 |
| 175 | 5 | 3.6 |
| 175 | 10 | 7.5 |
| 175 | 20 | 15.1 |
| 200 | 5 | 5.2 |
| 200 | 10 | 100 |
| 200 | 20 | 19.5 |

The data in Table IV indicates that higher substrate temperatures lead to thicker Co films using CCTNBA as the Co film precursor.

Example 13

Preparation of CCTMA Solution

Solutions of CCTMA in hexane were prepared by dissolving CCTMA in hexane while stirring using a magnetic stir bar. A solution of 70% wt. % CCTMA in hexane was prepared by stirring the solid in hexane at 20° C. for 10 minutes.

Example 14

Preparation of CCTPA Solution

Solutions of CCTPA in hexane were prepared by dissolving CCTPA in hexane while stirring using a magnetic stir bar. A solution of >50% wt. % CCTPA in hexane was prepared by stirring the solid in hexane at 20° C. for 5 minutes.

Example 15

Selective deposition of Co films using CCTNBA at 125° C.

During the deposition process, CCTNBA was delivered to the reactor chamber by passing 50 sccm argon through stainless steel containers filled with CCTNBA. The process conditions were: container temperature 50° C., hydrogen flow 500 sccm, chamber pressure 10 torr, deposition time 1 minute. The substrate temperature was 125° C. The substrates were copper metal or thermal $SiO_2$.

Table V shows the deposition results for Co film deposition on copper and $SiO_2$ using CCTNBA as the cobalt precursor material. Selectivity is defined as the ratio of film thickness of cobalt on copper vs. the film thickness of cobalt on $SiO_2$. Cobalt film thickness was measured using XRF. The wafers were pre-cleaned with 100, 200 or 500 W hydrogen plasma at 125° C. for 1 and 3 min.

TABLE V

| Sample # | $H_2$ plasma pre-treatment time, min | Hydrogen plasma power, W | Co Thickness on $SiO_2$ (Angstroms) | Co Thickness on Copper (Angstroms) | Selectivity |
|---|---|---|---|---|---|
| 1 | 1 | 100 | 1.05 | 17.82 | 17.0 |
| 2 | 1 | 200 | 1.18 | 18.09 | 15.3 |
| 3 | 3 | 100 | 1.05 | 14.68 | 14.0 |
| 4 | 3 | 200 | 1.44 | 20.84 | 14.5 |
| 5 | 3 | 500 | 1.97 | 23.33 | 11.9 |

Over a set of five experiments, the average selectivity of film thickness of cobalt on copper vs. the film thickness of cobalt on $SiO_2$ is 14.5.

Example 16

Selective Deposition of Co Films using CCTNBA at 150° C.

During the deposition process, CCTNBA was delivered to the reactor chamber by passing 50 sccm argon through stainless steel containers filled with CCTNBA. The process conditions were: container temperature 50° C., hydrogen flow 500 sccm, chamber pressure 10 torr, deposition time 1 minute. The substrate temperature was 150 ° C. The substrates were copper metal or thermal $SiO_2$.

Table VI shows the deposition results for Co film deposition on copper and $SiO_2$ using CCTNBA as the cobalt precursor material. Selectivity is defined as the ratio of film thickness of cobalt on copper vs. the film thickness of cobalt on $SiO_2$. Cobalt film thickness was measured using XRF.

TABLE VI

| Sample # | $H_2$ plasma pre-treatment time, min | Hydrogen plasma power, W | Co Thickness on $SiO_2$ (Angstroms) | Co Thickness on Copper (Angstroms) | Selectivity |
|---|---|---|---|---|---|
| 1 | 1 | 200 | 3.41 | 17.96 | 5.3 |
| 2 | 1 | 400 | 2.62 | 18.35 | 7.0 |

Over a set of five experiments, the average selectivity of the film thickness of cobalt on copper vs. the film thickness of cobalt on $SiO_2$ is 6.2, showing that the selectivity is lower at higher deposition temperatures due to higher amounts of cobalt deposited on the dielectric substrate while the cobalt deposited on the metal was unchanged.

Example 17

Annealing of cobalt films formed from CCTNBA

During the deposition process, CCTNBA was delivered to the reactor chamber by passing 50 sccm argon through stainless steel containers filled with CCTNBA. The process conditions were: container temperature 60° C., hydrogen flow 500 sccm, pressure 10 torr, deposition time 100 minutes. The $SiO_2$ substrate temperature was 125° C.

In the experiment where substrate plasma pretreatment was performed, the pretreatment conditions were: hydrogen flow 500 sccm, plasma power 200 W, pretreatment time 3 minutes, hydrogen pressure 1 torr.

The conditions for post-deposition annealing treatment were: nitrogen flow 450 sccm, hydrogen flow 50 sccm, temperature 400° C., chamber pressure 50 torr, anneal time 30 minutes.

Table VII shows the effect of annealing on the resistivity of the deposited cobalt films. The annealing process lowers the resistivity of the cobalt metal films.

TABLE VII

| Plasma Pretreatment | XRF ug/cm² | Thickness (Angstroms) | Before anneal $\Omega$/sq | Before anneal $\Omega \cdot cm$ | After anneal $\Omega$/sq | After anneal $\Omega \cdot cm$ |
|---|---|---|---|---|---|---|
| Yes | 22.64 | 297 | 17.2 | 5.1E-05 | 5.6 | 1.7E-05 |
| No | 23.14 | 303 | 17.7 | 5.4E-05 | 5.9 | 1.8E-05 |

While the principles of the invention have been described above in connection with preferred embodiments, it is to be clearly understood that this description is made only by way of example and not as a limitation of the scope of the invention.

The invention claimed is:

1. A method of depositing cobalt on a substrate in a reactor, comprising steps of:
   providing the substrate to the reactor;
   providing a Co precursor to the reactor;
   contacting the substrate with the Co precursor;
   forming Co containing film on the substrate;
   annealing the Co containing film; and
   optionally
   performing a pre-treatment to remove contaminates from surface of the substrate before the step of providing a Co precursor to the reactor;
   wherein
   the Co precursor is a disubstituted alkyne dicobalt carbonyl hexacarbonyl compound having the formula $Co_2(CO)_6$ ($R_1C \equiv CR_2$); wherein $R_1$ is a tertiary alkyl group and R2 is selected from the group consisting of ethyl, n-propyl, n-butyl, n-pentyl, n-hexyl, isoproppyl and isobutyl;
   the substrate is selected from the group consisting of metal, metal oxide, metal nitride, silicon, silicon oxide, silicon nitride, TaN, and combinations thereof; and
   the Co containing film is selected from a group consisting of cobalt film, cobalt oxide film, cobalt silicide film, cobalt nitride film, and combinations thereof.

2. The method of claim 1, wherein the annealing brings down resistivity of the cobalt containing film.

3. The method of claim 1, wherein the disubstituted alkyne dicobalt carbonyl hexacarbonyl compound is a liquid compound at a temperature equal to or less than 30° C.

4. The method of claim 1, wherein the disubstituted alkyne dicobalt carbonyl hexacarbonyl compound is (2,2-Dimethyl-3-octyne) dicobalt hexacarbonyl (CCTNBA).

* * * * *